United States Patent [19]
Lantsman

[11] Patent Number: 5,589,041
[45] Date of Patent: Dec. 31, 1996

[54] PLASMA SPUTTER ETCHING SYSTEM WITH REDUCED PARTICLE CONTAMINATION

[75] Inventor: Alexander D. Lantsman, Middletown, N.Y.

[73] Assignees: Sony Corporation, Tokyo, Japan; Materials Research Corp., Orangeburg, N.Y.

[21] Appl. No.: 488,060

[22] Filed: Jun. 7, 1995

[51] Int. Cl.$^6$ ............................................. C23C 14/54
[52] U.S. Cl. .......................... 204/192.33; 204/298.09; 204/298.32
[58] Field of Search ................ 204/192.33, 298.09, 204/298.31, 298.32; 156/345 MP, 345 P

[56] References Cited

U.S. PATENT DOCUMENTS

| | | | |
|---|---|---|---|
| 4,933,063 | 6/1990 | Katsura et al. | 204/298.03 |
| 5,254,171 | 10/1993 | Hayakawa | 118/723 MR |
| 5,264,488 | 11/1994 | Minato et al. | 156/345 |

FOREIGN PATENT DOCUMENTS

| | | | |
|---|---|---|---|
| 0650182 | 4/1993 | European Pat. Off. | |
| 4007123 | 12/1991 | Germany | |
| 63-238266 | 10/1988 | Japan | 204/298.09 |
| 63-297555 | 12/1988 | Japan | 204/298.09 |
| 4-365859 | 12/1992 | Japan | 204/298.09 |

OTHER PUBLICATIONS

Honda Masao, "Processing Device".
Patent Abstracts of Japan; JP62115708; Publication Date 27 May 1987; vol. 11, No. 329.

Serizawa Masayoshi et al., "Plasma Processing Apparatus".
Patent Abstracts of Japan; JP62012129; Publication Date 21 Jan. 1987; vol. 11, No. 179.

*Primary Examiner*—Aaron Weisstuch
*Attorney, Agent, or Firm*—Wood, Herron & Evans, P.L.L.

[57] ABSTRACT

A plasma processing system for sputter etching a substrate with reduced particle contamination comprises a plasma processing chamber having an interior surface which defines a processing space containing a substrate. An electrical element couples electrical energy into a portion of the processing space to generate a plasma therein for etching the substrate. A heating device is coupled to the reactor and is operable for controllably heating the processing chamber interior surface to a selected temperature. The heating device is controlled by a temperature control circuit which turns the heating device to an ON state and operates the heating device to heat the processing chamber to a selected temperature when the electrical element is not coupling energy to the processing chamber and the plasma is extinguished. The selected temperature achieved by the heating device is related to the temperature of the processing chamber during plasma generation such that the interior surface is maintained at a relatively constant temperature before, during and after processing to prevent flaking of sputter material from the interior surface and generation of contamination particles within the processing space.

22 Claims, 2 Drawing Sheets

PLASMA SPUTTER ETCHING SYSTEM WITH REDUCED PARTICLE CONTAMINATION

FIELD OF THE INVENTION

This invention relates generally to plasma processing of a substrate, and particularly to an apparatus and method for reducing particle contamination during plasma sputter etching of a substrate.

BACKGROUND OF THE INVENTION

In the processing of semiconductor workpieces or substrates into integrated circuits excited gas plasmas are often utilized. One such plasma processing method is sputter etching which is used to remove a layer of unwanted material from the substrate surface. The process of sputter etching is generally known and utilizes ionized particles of the charged gas plasma to bombard the surface of a substrate and dislodge or "sputter" away other substrate particles from the surface of the substrate.

In plasma sputter etching, a plasma gas is typically introduced into the processing space of a processing chamber. The processing chamber is preferably vacuum sealed and may be typically fabricated from quartz or another suitable dielectric material. The substrate to be etched is supported on an electrically charged base or electrode within the processing chamber whereon the substrate develops an electrical charge or bias. The plasma gas is introduced into the chamber opposite the surface of the charged substrate, and energy is coupled to the gas through the processing chamber, such as by using an inductive coil which surrounds the processing chamber. The energy from the induced electric field of the coil ionizes the gas particles so that they acquire a net charge that is of opposite polarity to the charge of the substrate support and substrate, and collectively form a gas plasma or plasma cloud. Since the charge of the ionized particles of the plasma and the charge of the substrate are of opposite polarities, the ionized particles in the plasma are attracted to the substrate surface, bombarding the surface and dislodging material particles to etch the wafer surface.

One significant drawback to sputter etching is that the etched material sometimes appears back on the substrate, contaminating the surface and the IC devices formed thereon. More specifically, the material which is etched away from the substrate surface generally deposits on the interior surfaces and walls of the processing chamber. During the process of sputter etching, the processing chamber heats up to a processing temperature due to the energy within the excited plasma and the bombardment and etching of the substrate. After completion of the etching, the inductively coupled energy to the generated plasma is interrupted and the plasma is extinguished. The processing chamber then cools down to the ambient room temperature. The resulting range of the temperature swing between processing and ambience may be approximately 80°–180° C., depending upon the process and the chamber geometry. The wide temperature variation of the processing chamber adversely affects the adhesion of the sputter etched material to the interior surfaces and walls of the processing chamber. The temperature variation of typical plasma processing chamber deteriorates the binding forces between the interior chamber surface and the deposited material, which is typically $SiO_2$ or another oxide, and between the adjacent layers of the wall deposition. The deterioration of the binding forces creates flaking or peeling of etched material pieces from the walls. The flaked pieces travel back to the substrate and produce irreversible damage through particle contamination of the substrate surface.

The contamination limits the process yield and performance of the plasma processing chamber and decreases the effective lifetime of the processing chamber. Furthermore, the particle contamination reduces the overall productivity of the sputter etching process and increases the cost of the process.

Accordingly, it is an objective of the present invention to reduce contamination in a plasma sputtering etching process. It is a further objective to reduce particle contamination by reducing or eliminating the peeling of etched material pieces from the interior walls of the processing chamber.

It is an additional objective of the present invention to improve the performance of the sputter etching process and to increase the effective yield and throughput of substrates in a plasma sputter etching system. Furthermore, it is an objective to increase the effective life of a sputter processing chamber and to increase the overall productivity of a plasma sputter etching system while reducing operational costs.

SUMMARY OF THE INVENTION

The present invention addresses these and other objectives by providing a system for plasma sputter etching a substrate which effectively reduces the temperature range through which the processing chamber is cycled during a plasma sputter etching process. More specifically, the plasma sputter etching system of the invention comprises a plasma processing chamber having an interior surface or wall which defines a processing space therein to contain a substrate which is to be sputter etched. An inductive electrical element, such as an inductive coil, surrounds or is otherwise coupled to the processing chamber to inductively couple electrical energy into the plasma space to generate a sputtering plasma therein. The coil is preferably wrapped around the outside of the processing chamber and includes coil loops which extend in generally horizontal planes around the processing chamber. A heating device is coupled to the chamber and particularly to the walls of the chamber and is operable to controllably heat the chamber to a selected temperature such that the interior surfaces and walls are maintained at a generally consistent temperature. The stable temperature reduces the large temperature swing associated with conventional plasma sputter etching systems and reduces flaking of etched materials from the chamber walls.

In a preferred embodiment, the heating device includes a coil which is wrapped around the processing chamber and contacts the processing chamber to conductively heat the chamber. Preferably, the loops of the heater coil are oriented vertically to reduce mutual electrical coupling between the heater coil and the plasma coil. Alternatively, a heating coil or other suitable heating device might be incorporated within the walls of the processing chamber or may contact the interior surface of the chamber within the processing space. A temperature control circuit is connected to the heater coil and controls the temperature of the heater coil to effectively reduce the temperature variation of the interior chamber walls between the plasma generation and etching and the extinguishing of the plasma and cessation of the etching. The inductive coil is controlled by a plasma control circuit which provides electrical energy to both the inductive coil and the substrate support for biasing the substrate. The plasma control circuit is operably linked to the temperature control circuit and the temperature control circuit is responsive to the plasma control circuit to know when a plasma is being generated, and when plasma generation has ceased.

In one preferred embodiment of the invention, the temperature control circuit of the invention interrupts power to the heater coil and effectively turns the coil to an OFF state when a plasma is generated and etching occurs. During plasma generation and etching, the processing chamber heats up to a processing temperature. When the substrate has been sufficiently etched, the plasma control circuit turns off its supply of power to the inductive coil to stop the plasma generation and the plasma is extinguished. At that time, the temperature control circuit senses the end of the etch and turns the heater coil to an ON state by supplying power to the heater coil. The temperature control circuit operates the heating coil at a temperature which is sufficient to maintain the chamber at the processing temperature achieved during the etch. In turn, the interior surface of the processing chamber is maintained at its processing temperature. The temperature control circuit of the invention includes appropriate thermocouple and sensing devices for determining the chamber temperature during heating for proper maintenance of the chamber at the desired processing temperature. The selected processing temperature of the chamber during the etch may be manually determined so that the temperature control circuit is set to operate the heater coil as desired. Alternatively, the temperature control circuit may include a sensing device which measures the etch process chamber temperature and automatically sets the control circuit to the desired operation point for controlling the heater coil.

By maintaining the processing chamber at a high temperature and preventing the processing chamber from cooling down to ambient room temperature, the integrity of the bond between the chamber walls and the deposited material and between the various layers of deposited material is maintained to prevent flaking or peeling of material from the chamber walls. Thereby, the generation of contaminating particles is reduced or eliminated, thus increasing the efficiency of the sputter etching process as well as the substrate throughput rate while decreasing the processing costs. Furthermore, by eliminating the effect of temperature cycling of the processing chamber, the life of the chamber is increased.

Utilizing the present invention, a 90° cyclical temperature variation was reduced to approximately a 5° cyclical temperature variation which effectively reduced the peeling and flaking of material particles from the chamber walls and reduced contamination of the etched substrates.

In an alternative embodiment of the invention, a fan is utilized and is coupled to the processing chamber to cool the processing chamber during sputter etching. The fan directs air into the space surrounding the chamber or exhausts air from the space around the chamber. The fan effectively reduces the overall processing temperature within the chamber and thereby reduces the temperature at which the heating coil must be operated for maintaining the chamber at a selected processing temperature when plasma generation and etching has ceased. The fan is preferably coupled in the temperature control circuit to operate in conjunction with the heater. In one preferred embodiment of the invention, the fan is turned ON during etching and is then turned OFF when the etching stops and the heater coil is turned ON to the selected processing temperature. The reduced temperatures provide more stable temperature control of the chamber for further reduction of flaking and peeling.

The present invention is particularly useful for plasma sputter etching, but may also be utilized for other plasma processes wherein material layers are deposited upon the chamber walls such as plasma sputter deposition and other plasma reactions.

The above and other objects and advantages of the present invention shall be made more readily apparent from the accompanying drawings and the description below.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
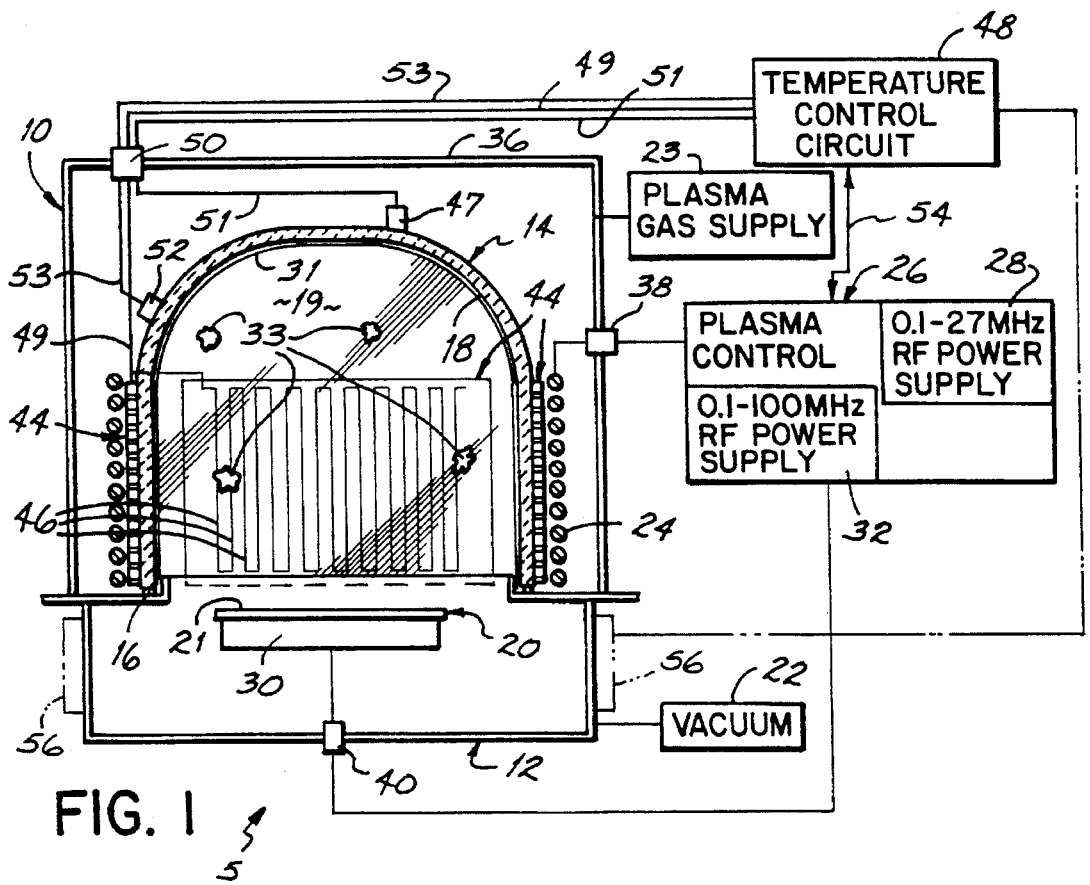
FIG. 1 is a schematic view of a plasma processing chamber utilizing the present invention.

FIG. 1 illustrates a plasma processing system for processing a substrate, and particularly for plasma sputter etching a substrate with reduced particle contamination. The system 5 comprises a plasma processing chamber 10 including a base 12 and a dielectric, non-conductive cover 14, which is constructed of a suitable dielectric material such as quartz or ceramic. Cover 14 is often referred to as a bell jar. Base 12 and cover 14 are suitably coupled together with a vacuum seal 16 and the interior surface 18 of cover 14 defines a processing space 19 to contain a substrate 20 which is to be sputter etched. Base 12 is coupled to a suitable vacuum system 22 which evacuates the processing space 19 to the desired processing pressure. Processing plasma space 19 is also coupled to a plasma gas supply 23 for introducing plasma gas.

To generate an excited plasma within processing space 19, an inductive coil 24 is wrapped around the outside of cover 14. Coil 24 is coupled to a plasma control circuit 26 which typically includes an RF power supply 28 which operates in the range of 0.1–27 MHz. The plasma control circuit 26 includes a suitable RF matching network (not shown) to electrically match the RF power supply 28 to the coil 24. Power supply 28 and coil 24 create an inductive field in processing space 19 to inductively excite gas in space 19 to form a plasma. Alternatively, other appropriate energy sources might be utilized to generate a plasma in space 19, such as a non-inductive source.

Substrate 20 is supported inside the processing chamber and proximate processing space 19 by a pedestal or support 30. Pedestal 30 acts as an electrode and is electrically coupled to the plasma control circuit 26 and is specifically coupled to an RF power supply 32 which operates in a 0.1–100 MHz range. Plasma control circuit 26 operates the respective RF power supplies 28 and 32 to generate a plasma and simultaneously bias the pedestal 30 to bias substrate 20 such that excited particles from the generated plasma bombard the exposed upper surface 21 of substrate 20 to sputter etch the substrate. Plasma control circuit 26 includes a computer processor (not shown) which controls the process timing and delivery of energy to coil 24 and pedestal 30 for proper plasma sputter etching.

Processing chamber 10 also includes a shield 36 which surrounds cover 14 and protects operating personnel against RF, UV, and other radiation associated with the plasma etching process. Shield 36 also serves as a mounting support for an electrical feedthrough 38 coupled to a plasma control circuit 26. A similar electrical feedthrough 40 couples pedestal 30 to the plasma control circuit 26 through base 12.

During the plasma sputter etching process, a plasma gas is introduced into processing space 19 inside the processing chamber 10. The plasma control circuit 26 then provides energy to coil 24, and the coil 24 inductively couples energy through dielectric cover 14 and into the plasma base to generate an active plasma. Subsequently, the plasma control circuit 26 provides RF power to pedestal 30 to bias the substrate 20. The biased substrate 20 attracts charged particles from the generated plasma and the charged particles bombard surface 21 of substrate 20 to sputter etch away a layer of material from the substrate 20. The sputter etched material removed from substrate 20 deposits upon surfaces within processing space 19, and particularly deposits on the interior surface 18 of cover 14 to form a layer of material 31.

During sputter etching, heat is generated by the plasma and the bombardment of substrate 20 and the temperature of cover 14 may increase anywhere from 100° to 200° C. depending upon the sputter etching process and the operation of the system. When sputter etching is complete, the plasma control circuit turns the respective RF power supplies 28, 32 OFF or otherwise interrupts the flow of power to the coil 24 and pedestal 30, and the generated plasma is extinguished. As a result, the processing chamber environment and particularly the cover 14 cools down and will eventually return to the ambient clean room temperature where the processing chamber 10 is located, which may be approximately 20° C. The wide temperature swing between the plasma processing temperature and ambient temperature, e.g., 80°–180° C., thermally stresses cover 14 and results in the deterioration of the binding forces between interior surface 18 and the layer 31 of sputtered material which have deposited upon the interior surface 18. The sputter material may typically be $SiO_2$ or some other oxide. The binding forces between successive material layers making up layer 31 are also deteriorated. The deterioration of the binding forces causes some of the deposited material 31 to peel off in pieces 33 and fall onto the substrate 20 thereby contaminating the substrate surface 21 and producing irreversible damage to the substrate 20. The pieces 33 are shown oversized for illustrative purposes. The contamination limits the process yield and the performance of the overall system 5 and decreases the effective lifetime of the processing chamber 10. The reduced yield increases the processing costs.

In accordance with the principles of the present invention, heat is applied to the processing chamber 10 and is specifically applied to cover 14 when etching is complete and the plasma is extinguished in order to maintain the temperature of cover 14 close to the processing temperature. The temperature stability reduces thermal stress on the cover and reduces deposition material peeling and flaking and subsequent contamination of substrate 20. In one preferred embodiment of the invention, the heater 44 is a foil heater which is wrapped around cover 14 to conductively heat the cover. Preferably, the foil heater 44 is in the shape of a coil and includes a plurality of coil turns 46. Referring to FIG. 1, the coil turns or loops 46 of heater coil 44 preferably are oriented on cover 14 to extend perpendicular to the loops of the inductive coil 24. Such an orientation minimizes mutual electrical coupling between heater coil and the inductive coil 24. While heater coil 44 is illustrated in FIG. I contacting the outer surfaces of cover 14, it might also take the form of a heater which is formed as part of the cover itself, such as being imbedded into the walls of cover 14. Alternatively, the heater may contact the interior surface 18 of cover 14.

Heater coil 44 is coupled to a temperature control circuit 48 by control line 49 which extends through an electrical feedthrough 50 in shield 36. Temperature control circuit 48 is operable to turn the heater coil ON and OFF and control the temperature of heater coil 44 to maintain cover 14 at the selected heater temperature when the etching is complete and the plasma is extinguished. The heater temperature is selected by monitoring the processing temperature during sputter etching. The heater temperature is related to the etch processing temperature, and preferably is approximately the same as the processing temperature to maintain the temperature of cover 14 constant before, during and after the etching process. The processing temperature may be manually measured with a temperature sensing device and the control circuit 48 appropriately set to operate at the selected heater temperature. Alternatively, an automated temperature sensor 47 may be attached to cover 14 and coupled to temperature control circuit 48 by line 51 through feedthrough 50. In that way, the processing temperature is monitored and the heater coil 44 is automatically set by control circuit 48 to operate at the selected temperature to maintain the chamber at the constant temperature and reduce layer peeling.

A temperature monitoring device 52 such as a thermostat or thermocouple, monitors the temperature produced by heater coil 44 and is connected to the temperature control circuit 48 through the electrical feedthrough 50 and line 53. The temperature control circuit 48, heater coil 44 and temperature monitoring device 52 provide a control loop for maintaining the temperature of cover 14 constant and stable at the selected processing temperature. By selectively and controllably heating cover 14, the interior surface 18 of cover 14 is maintained at a generally constant temperature, thus reducing the thermal stressing on interior surface 18 and reducing the resultant flaking of sputter deposition material from surface 18. Therefore, the present invention reduces particle contamination of a plasma sputter etched substrate 20 and increases the overall productivity and yield of processing chamber 10.

Figure 2:
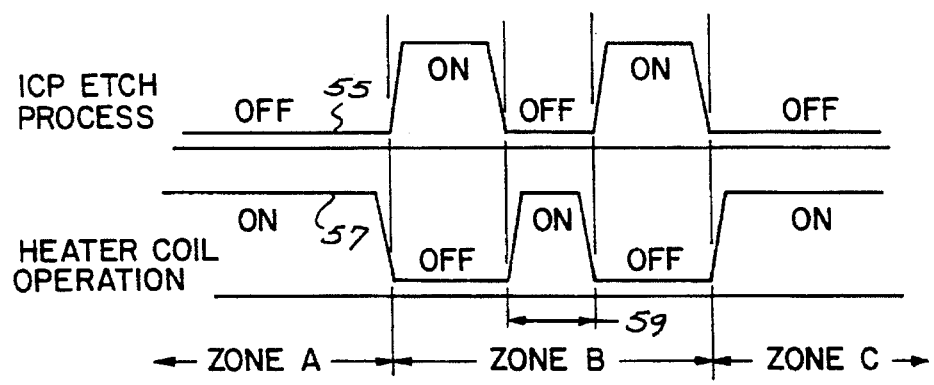
FIG. 2 is a timing diagram illustrating the operation of the temperature control circuit and plasma control circuit before, during and after a plasma sputter etching process.

Temperature control circuit 48 is coupled to the plasma control circuit 26 by a signal interface line 54 for automatic computer control of the etching process. FIG. 2 illustrates a typical timing diagram for control of the processing chamber 10 during a sputter etching process. In Zone A, which is a pre-processing zone, the plasma control circuit 26 turns the respective RF power supplies 28, 32 OFF so that no power is delivered to coil 24 or pedestal 30 and no etching occurs as indicated by line 55. Temperature control circuit 48 turns heater coil 44 ON (line 57) and operates the heater coil 44 at the selected temperature, which, as discussed above, is typically the steady state temperature which the cover 14 reaches during plasma sputter etching.

During the sputter etching process, indicated by Zone B if FIG. 2, plasma control circuit 26 turns the power supplies 28, 32 ON and provides the necessary RF power to inductive coil 24 and pedestal 30. A plasma is generated in the processing space 19 and sputter etching of substrate 20 occurs. The heat generated during the plasma sputter etching process heats up cover 14 and specifically heats up the interior surface 18. Cover 14 generally reaches a steady state plasma etching temperature. During processing, temperature control circuit 48 turns heater coil 44 OFF so that the temperature of cover 14 is not raised beyond the steady state processing temperature.

Within Zone B is a period, indicated by reference number 59, in which the etched substrate is removed and a new substrate placed in the processing chamber, for subsequent etching and processing of a series of substrates. During exchange period 59, the RF power supplies 28, 32 are briefly tuned OFF and the heater is turned ON to maintain a constant chamber temperature. Etching then resumes with the new substrate.

In Zone C, which is a post-processing zone, the operation of the plasma control circuit 26 and temperature control circuit 48 are similar the operation in Zone A, to maintain cover 14 and interior surface 18 at the desired constant temperature when the plasma has been extinguished. The present invention reduces the temperature variation of cover 14 and surface 18 from the typical 100°–180° C. range to a temperature swing of only a few degrees C, i.e., ±5° C. Ideally, no variation in temperature would occur; however, instrumental errors associated with heater coil 44, temperature control circuit 48, temperature monitoring device 52 and the plasma control circuit 26 produce a slight temperature variation of a few degrees which does not significantly affect the bonding of the material layer 31.

The timing diagram of FIG. 2 illustrates that the heater coil is turned ON at the exact time that the etch process is ceased. However, there may be time overlap, in which the heater coil is turned ON when the etch process is still continuing, without departing from the scope of the present invention. The temporal overlap between processing and operation of the heater coil should generally not be substantial, so as to keep the heater coil from affecting the overall plasma process.

While FIG. 1 illustrates a heater coil 44 contacts cover 14, an alternative embodiment of the invention may utilize a heater 56 which contacts base 12 and is controlled by control circuit 48 in order to more effectively reduce the temperature variations of the entire chamber 10 between sputter etching processes.

In one preferred embodiment of the invention, the plasma processing system 5 was built around the ICP (inductively coupled plasma) etching tool of the Eclipse-Mark II CPU controlled integrated etching and sputtering system available from Materials Research Corp. (MRC) of Orangeburg, N.Y. The system included an RF generator Model PDP2500 which operated at 450 kHz/1000 W and is available from Advanced Energy Industries, Inc. of Fort Collins, Colo. The RF generator 28 was coupled to coil 24 through a capacitive matching box (not shown). Pedestal 30 was driven by an RF generator Model ACG10B02 at 13.56 MHz/100 V through an L-type matching box (not shown). The ACG10B02 generator is available from ENI, Inc. of Rochester, N.Y. Signal interface 54 is provided by the signal interface of the Eclipse-Mark II system.

The heating of cover 14 in accordance with the principles of the present invention was provided by two thermal foil heaters, dimensioned 5 in.×10 in., Model No. HR5182R52.9 L 12B, and foil heater element dimensioned 5 in.×15 in. Model No. HR5183R35.3L12B which are available from MINCO Products, Inc. of Minneapolis, Minn. The heater elements were placed around the outside wall of cover 14 and were applied to cover 14 by pressure sensitive mounting adhesive #12 PSA, rated at 177° C. and also available from MINCO Products. The heater coils operated at 115/208 VAC and had a maximum temperature rating of 235° C. and included 1000 V rms insulation of silicon rubber around the conductor. The loops of the heater coils 44 were perpendicular to the loops of the inductive coil 24 as illustrated in FIG. 1. The heater coils 44 were evenly placed around on the outer surface of cover 14 which had an outer diameter of approximately 12 in., a height of approximately 6 in., and a circumference of approximately 37.7 in. Gaps of approximately 0.8 in. were between adjacent edges of the respective heater coils 44. Individual heater coils 44 were connected electrically in parallel and represented a single heating arrangement to the temperature control circuit 48.

Temperature control circuit 48 comprised a temperature controller Model 808 available from Watlow, Inc., of Hannibal, Mo. A K-type thermocouple was used as a temperature measuring element 52 while a line filter Model SK7 was used in the temperature control circuit 48 for the combined heater coils 44 and a line filter Model VB1 was utilized for the thermocouple 52. Both line filters are available from Corcom, Inc. of Libertyville, ILL. The power input to the temperature control circuit 48 was 115/208 VAC and as mentioned above, signal interface 54 was the signal interface from the Eclipse-Mark II system.

A typical plasma sputter etching process without the invention resulted in variations of the temperature of interior wall surface 18 in a range of $T_1=20°$ C. for ambient temperature and $T_2=110°$ C. as a processing temperature. Therefore, the thermal cycle was approximately 90° C. Incorporating the present invention, however, and setting temperature control circuit 48 to operate the heater coils 44 at $T_2=110°$ C. resulted in a stabilization of the temperature of surface 18 in cover 14. The resultant continuous temperature of surface 18 was T=110° C. ±5° C.; therefore, the thermal cycling was only approximately ±5° C. versus the 90° C. temperature variation without the invention. As a result, flaking or peeling of the sputter deposition material from surface 18 was reduced thereby reducing contamination of substrate 20 and increasing the productivity and yield of the processing chamber 10.

Through experimentation, it has been determined that the temperature variations of cover 14, and specifically surface 18, result both from "micro" temperature changes and "macro" temperature changes. Micro temperature changes are a result of cooling down of cover 14 during idle time between etching of consecutive substrates, i.e., during period 59 of FIG. 2. The rate of cooling is approximately 7° C./minute. The macro changes result from an increase of the cover temperature from ambient temperature of 20° C. to approximately 120°–200° C. during processing of a batch of substrates and the following cooling down of cover 14 back to the ambient temperature as discussed hereinabove. The increase occurs at approximately 15° C./minute while the decrease occurs at approximately 7° C./minute. In accordance with the principles of the invention, it is desirable to not only reduce the amount of temperature variation, but also to reduce the overall processing temperature so that the heater coils 44 may be operated at a lower temperature to produce greater thermal stability.

Figure 3:
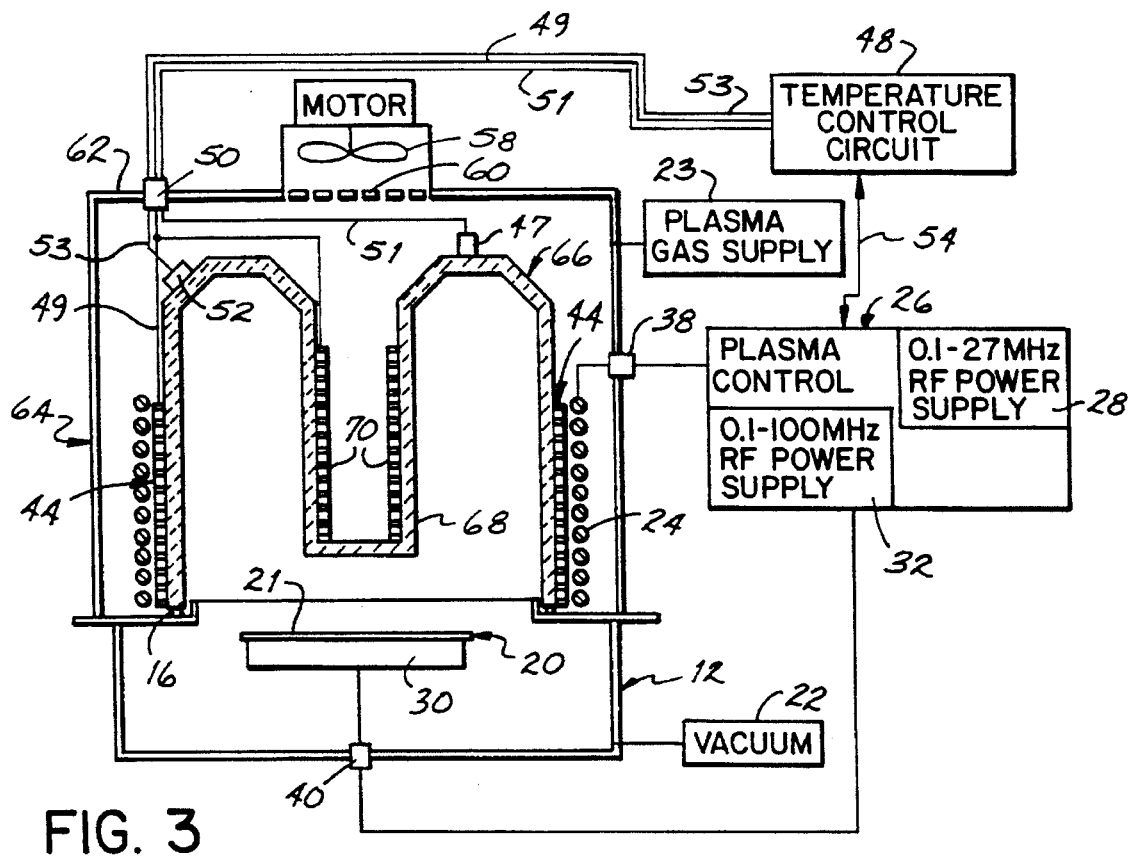
FIG. 3 is a schematic view of an alternative embodiment of the present invention utilizing a cooling fan for reduced temperature cycles.

In an alternative embodiment of the invention, as illustrated in FIG. 3, a fan 58 is utilized and is operably coupled to the plasma control circuit 26. As illustrated in FIG. 3, an opening 60 is formed in shield 62 which houses the plasma processing chamber 64. Chamber 64 utilizes an alternative cover 66 which includes a re-entrant plug 68 which may be utilized for plasma shaping as discussed in U.S. Pat. No. 5,391,281, incorporated herein by reference in its entirety.

In the alternative embodiment, heater coils 70 are placed on the exterior surface of the re-entrant plug 68 to provide temperature stabilization of the plug 68 and cover 66 as discussed hereinabove.

Fan 58 circulates cooling air around cover 66 to reduce the overall temperature of cover 66 during plasma sputter etching so that heater coils 44 and 70 do not have to be maintained at such a high temperature to produce a constant chamber cover temperature. During plasma processing, the heater coils 44, 70 are turned OFF and fan 58 is turned ON to reduce the temperature of cover 66 as it is heated by the plasma etching process. Subsequently, when coil 24 is OFF and the plasma is extinguished, the cooling fan 58 is turned OFF and heater coils 44, 70 are turned ON. Preliminary testing has demonstrated that micro temperature changes in the 2–5° C. range are noticeably reduced by turning the cooling fan off when no plasma is generated. To reduce the impact of the macro temperature changes in the 100°–200° C. range, cover 66 is maintained at an elevated processing temperature in between sputter etching batch cycles and also intermittently between the sputter etching of subsequent substrates in a batch. In summary, during operation of the processing chamber 64 of FIG. 3, the heating coils 44, 70 are ON and the fan is OFF when no plasma is generated and no etch occurs. Subsequently, the heating coils 44, 70 are turned OFF and the fan is turned ON when power is provided to inductive coil 24 to produce a plasma sputter etched substrate 20.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A plasma processing system for plasma sputter etching a substrate with reduced particle contamination comprising:

a plasma processing chamber having an interior surface to define a processing space therein to contain a substrate to be sputter etched and including a vacuum system for creating a vacuum environment in said processing space;

an electrical element coupled to the plasma processing chamber for coupling electrical energy into at least a portion of the processing space through the interior surface for generating a plasma therein to etch the substrate which thereby produces a temperature rise in the processing chamber interior surface up to a processing temperature, the element being operable for interrupting the electrical energy to the processing space so that the plasma is extinguished when the plasma processing is complete;

a heating device coupled to the plasma processing chamber externally of the vacuum processing space and operable for controllably heating the processing chamber interior surface;

a temperature control circuit connected to the heating device to control the operation and temperature of the heating device, the temperature control circuit turning the heating device to an ON state and operating the heating device for heating the processing chamber interior surface to approximately said processing temperature approximately at the time when the electrical element is interrupting energy to the processing chamber and the plasma is being extinguished, the temperature of the chamber interior space, after plasma generation, being maintained by the temperature control circuit approximately at the processing temperature of the processing chamber interior space during plasma generation, such that the chamber interior surface is maintained at a relatively constant temperature during plasma processing and for a predetermined time before and thereafter to prevent the flaking of deposited sputtered material from the processing chamber interior surface and the generation of contamination particles within the processing space;

whereby contamination of the sputter etched substrate is reduced.

2. The plasma processing system of claim 1 wherein the temperature control circuit is further operable to turn the heating device to an OFF state approximately at the time when the electrical element is coupling electrical energy to the processing chamber and a plasma is being generated.

3. The plasma processing system of claim 1 wherein the electrical element includes an inductive coil which is wrapped around the plasma processing chamber to inductively couple energy into the plasma space.

4. The plasma processing system of claim 3 wherein the heating device includes a heating coil contacting the plasma processing chamber to conductively heat the plasma processing chamber and heat the interior surface.

5. The plasma processing system of claim 4 wherein the heating coil has coil loops extending in a direction generally perpendicular to the direction of coil loops of the inductive coil for reducing the mutual coupling of electrical energy between the two coils.

6. The plasma processing system of claim 1 further comprising a plasma control circuit coupled to the electrical element and the temperature control circuit, the plasma control circuit operable to provide power to the electrical element and to provide an interface signal to the temperature control circuit for operating the heating device to heat the chamber interior surface approximately at said processing temperature approximately at the time when power to the electrical element is interrupted and the plasma is extinguished.

7. The plasma processing system of claim 1 wherein the heating device includes a heating coil contacting the plasma processing chamber to conductively heat the plasma processing chamber and to heat the interior surface.

8. The plasma processing system of claim 1 further comprising a fan device, the fan device operable to direct air around the plasma processing chamber when a plasma is being generated to cool the processing space during the plasma processing of the substrate.

9. The plasma processing system of claim 8 wherein the fan device is further operable to turn to an OFF state when a plasma is not being generated.

10. The plasma processing system of claim 1 wherein the processing chamber includes a reentrant portion extending into the processing space, the heating device being coupled to the reentrant portion and operable to heat the reentrant portion to said processing temperature.

11. The plasma processing system of claim 1 further comprising a temperature sensing device coupled to said plasma processing chamber and said temperature control circuit, the sensing device measuring the temperature of the chamber which is proportional to the temperature of the interior surface and operable to provide an input signal to the temperature control circuit for adjusting the heating device to maintain the chamber interior surface approximately at said processing temperature.

12. The plasma processing system of claim 1 further comprising a temperature measuring device coupled to the chamber during plasma processing for measuring the chamber temperature which is proportional to the processing temperature of the interior surface and determining said processing temperature, the measuring device being coupled to said temperature control circuit for providing an input signal related to said processing temperature, the temperature control circuit using said input signal to operate the heating device approximately at said processing temperature.

13. A method of sputter etching a substrate with a plasma with reduced particle contamination of the substrate, comprising:

positioning a substrate within a processing space of a plasma processing chamber, the chamber having an interior surface surrounding a portion of the processing space;

creating a vacuum environment in the processing space;

introducing a plasma gas into the processing chamber;

coupling electrical energy with an electrical element through the interior surface and into at least a portion of the processing space and the plasma gas for generating a plasma therein to etch the substrate wherein the interior surface is heated to a processing temperature, and subsequently interrupting the flow of energy to the processing space so that the plasma is extinguished when plasma processing is complete;

controllably heating the plasma processing chamber with a heating device externally of the vacuumed processing space to maintain said interior surface at approximately the processing temperature approximately at the time when energy to the processing space is interrupted and the plasma is being extinguished, the temperature of the interior surface of the chamber, after plasma generation, being maintained at approximately said processing temperature of the chamber during plasma generation such that the processing chamber interior surface is maintained at a relatively constant temperature during plasma processing and for a predetermined time before and thereafter to prevent the flaking of deposited sputtered material from the processing chamber interior surface and the generation of contamination particles within the processing space;

whereby contamination of the sputter etched surface is reduced.

14. The method of claim 13 further comprising interrupting the operation of the heating device approximately at the time when energy is being coupled into the processing space and a plasma is being generated, such that the chamber interior surface is not heated extensively by said heating device during the processing of the substrate.

15. The method of claim 13 further comprising controllably heating the plasma processing chamber with a coil heating device having loops contacting a portion of the chamber.

16. The method of claim 15 further comprising inductively coupling electrical energy into the plasma processing chamber with an inductive coil having loops wrapped around the chamber, the loops of the inductive coil extending in a direction generally perpendicular to the loops of the coil heating device.

17. The method of claim 13 wherein the processing chamber includes a fan, the method further comprising operating the fan to direct air around the plasma processing chamber when a plasma is being generated to effectively reduce the processing temperature of the chamber interior surface.

18. The method of claim 17 further comprising interrupting operation of the fan when the plasma is extinguished and the processing chamber is heated.

19. The method of claim 13 wherein the heating device is coupled to a temperature control circuit for operating the heating device, the method further comprising interrupting the operation of the heating device through the temperature control circuit approximately at the time when a plasma is being generated and operating the heating device through the temperature control circuit to heat the chamber interior surface at said temperature approximately at the time when the plasma is being extinguished.

20. The method of claim 19 wherein the electrical element is coupled to a plasma control circuit for controlling the delivery of energy to the electrical element and the generation of said plasma, the method further comprising interfacing the plasma control circuit with the temperature control circuit such that the temperature control circuit operates the heating device when the plasma control circuit interrupts energy delivery to the electrical element to extinguish the plasma.

21. The method of claim 19 further comprising intermittently turning the heating device ON and OFF through the temperature control circuit when the plasma is intermittently generated and extinguished.

22. The method of claim 13 further comprising monitoring the temperature of a portion of the plasma processing chamber and providing an input signal to the heating device in response to said monitored temperature to controllably and selectively adjust the temperature of the heating device to maintain the chamber interior surface at said processing temperature.

* * * * *